United States Patent
Seki et al.

[11] Patent Number: 5,959,784
[45] Date of Patent: Sep. 28, 1999

[54] OPTICAL PROJECTION SYSTEMS AND PROJECTION-EXPOSURE APPARATUS COMPRISING SAME

[75] Inventors: Masami Seki, Shiki; Hiroshi Chiba, Yokohama, both of Japan

[73] Assignee: Nikon Corporation, Tokyo, Japan

[21] Appl. No.: 08/850,733

[22] Filed: Apr. 24, 1997

[30] Foreign Application Priority Data

Apr. 24, 1996 [JP] Japan .................................. 8-129153

[51] Int. Cl.⁶ .......................... G02B 13/22; G02B 17/00
[52] U.S. Cl. ........................... 359/663; 359/726; 359/730
[58] Field of Search .................... 359/663, 726, 359/730

[56] References Cited

U.S. PATENT DOCUMENTS

| | | |
|---|---|---|
| 5,581,075 | 12/1996 | Naraki et al. . |
| 5,585,972 | 12/1996 | Markle ................................... 359/732 |
| 5,729,331 | 3/1998 | Tanaka et al. ............................ 355/53 |

FOREIGN PATENT DOCUMENTS

0 723 173 A2   7/1996   European Pat. Off. .

*Primary Examiner*—Scott J. Sugarman
*Attorney, Agent, or Firm*—Klarquist Sparkman Campbell Leigh & Whinston, LLP

[57] ABSTRACT

The invention pertains to optical projection-exposure apparatus for photolithography that can focus a pattern defined by a mask onto a non-flat substrate. In one embodiment, piezoelectric elements are used as an actuator for adjusting the optical path length between the mask and the substrate. A first reflector reflects a light flux transmitted by the mask. A telecentric optical system then forms an image of the mask in a focal plane. A second reflector reflects the light flux from the telecentric perpendicularly onto the substrate. The actuator moves the first or second reflectors, changing the optical path length of the light flux. A focus sensor detects the height of the sensitized surface of the substrate in a direction perpendicular to the sensitized surface of the substrate and thereby provides a focus signal to the actuator. The actuator then moves the focal plane to the sensitized surface.

39 Claims, 6 Drawing Sheets

OPTICAL PROJECTION SYSTEMS AND PROJECTION-EXPOSURE APPARATUS COMPRISING SAME

FIELD OF THE INVENTION

This invention relates to optical projection systems and projection-exposure apparatus for the manufacture of semiconductor devices or liquid crystal display panels.

BACKGROUND OF THE INVENTION

Figure 9:
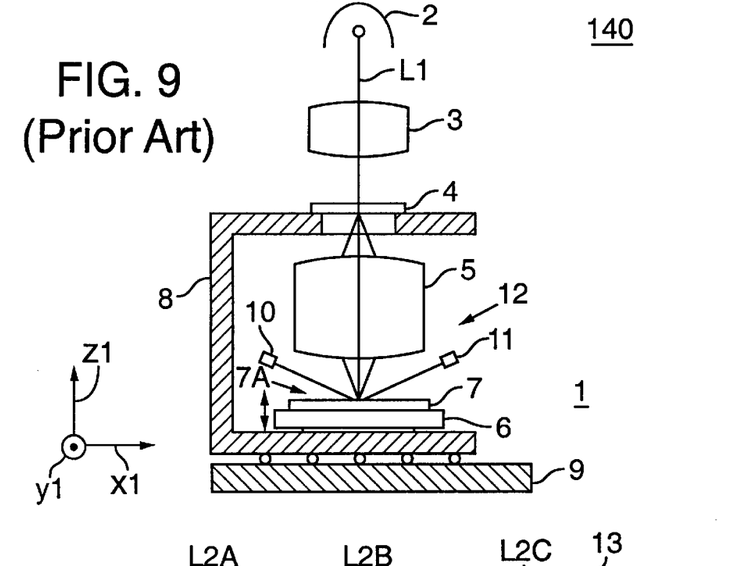
FIG. 9 shows a conventional projection-exposure apparatus.

Manufacturing processes for integrated circuits and liquid crystal display panels typically use optical projection-exposure apparatus to project patterns from a mask onto a substrate. A conventional projection-exposure apparatus 1 is shown in FIG. 9. A light flux L1 from a light source 2 irradiates a mask 4 by means of an optical illumination system 3. The optical illumination system 3 generally comprises a converging lens. The light flux L1 is transmitted by the mask 4 and enters an optical projection system 5 that directs the light flux L1 onto a sensitized surface 7A of a substrate 7. The substrate 7 is held by a Z1-axis stage 6 such that the mask 4 and the substrate 7 are in separate planes parallel to the X1-Y1 plane. The Z1-axis stage 6 adjusts so that the substrate 7 moves along the Z1-axis while remaining in a plane parallel to the plane of the mask 4.

The mask 4 and the Z1-axis stage 6 are fixed to a scan stage 8; the scan stage 8 is held on a stage base 9 so that the scan stage 8 (along with the mask 4 and the Z1-axis stage 6) is movable in the X1-direction and the Y1-direction. In addition, the light source 2, the optical illumination system 3, and the optical projection system 5 are fixed to the stage base 9 by attachment elements not shown in FIG. 9.

A focus sensor 12 comprising a light emitter 10 and a photodetector 11 is placed near the Z1-axis stage 6. The light emitter 10 emits light that is reflected by the sensitized surface 7A to the photodetector 11. A signal output from the focus sensor 12 is used to control the height of the Z1-axis stage 6. By raising or lowering the Z1-axis stage 6, the sensitized surface 7A of the substrate 7 is positioned at the focal plane of the optical projection system 5.

In operation, the scan stage 8 of the projection-exposure apparatus 1 scans at a fixed rate in the X1 and Y1-directions. During this scanning, the focus sensor 12 is used to keep the sensitized surface 7A of the substrate 7 at the focal plane of the optical projection system 5. Thus, the sensitized surface 7A of the substrate 7 is exposed by the light flux L1 to patterns from the mask 4.

The conventional projection-exposure apparatus 1 is difficult to make compact because the Z1-axis stage 6 must adjust the sensitized surface 7A to be at the focal point of the optical projection system 5. In addition, the Z1-axis stage 6 is complex and expensive.

In recent years liquid crystal panels have become widely used in word processors, personal computers, and television. Liquid crystal panels for these applications require transparent thin-film electrodes on large glass substrates; photolithographic processes generally define the shape and location of these electrodes. Therefore, it is necessary that a projection-exposure apparatus implementing the photolithographic processes produce well-formed patterns on large substrates.

Figure 10:
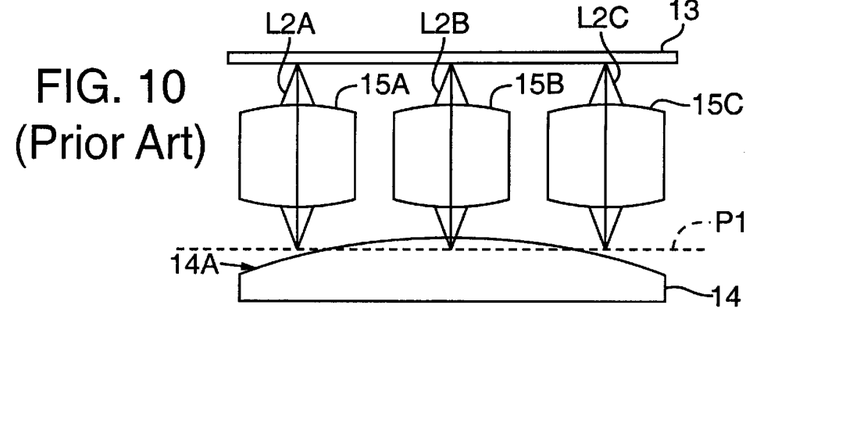
FIG. 10 shows a conventional projection-exposure apparatus using a plurality of optical projection systems.

A conventional projection-exposure apparatus for large substrates is shown in FIG. 10. As shown in FIG. 10, the projection-exposure apparatus comprises a plurality of optical projection systems 15A, 15B, 15C arranged parallel to a mask 13 and a substrate 14. The plurality of optical projection systems 15A, 15B, 15C exposes a plurality of corresponding regions on the substrate simultaneously. This type of exposure speeds substrate processing.

Because the focal points of the optical projection systems 15A, 15A, 15B, 15C are fixed, it is difficult to focus patterns from the mask 13 at the plurality of regions on the substrate 14, Focus is accomplished by moving a sensitized surface 14A of the substrate 14 to the plane P1 on which the optical projection systems 15A, 15B, 15C are focused. This focus method works when the sensitized surface 14A is flat. When the sensitized surface 14A is not flat, there will be focus errors. Because the optical projection systems 15A, 15B, 15C are fixed with respect to each other, achieving best-focus for a selected optical projection system fixes the focus of the remaining optical projection systems. When the substrate is not flat, the best-focus positions differ for the optical projection systems 15A, 15B, 15C. Such focus errors degrade the resolution with which patterns are transferred. In high-resolution photolithography, even small focus errors are generally unacceptable.

When large substrates are to be exposed in a single exposure, the sensitized surface 14A must be flat. Because keeping a thin substrate flat is difficult, focus errors generally occur. For example, even if the Z1-axis stage 6 (not shown in FIG. 10, but see FIG. 9) is adjusted so that focus is perfect for the light flux light L2A, the images associated with the light fluxes L2B, L2C are not properly focused if the substrate 14 is not flat. Accordingly, lack of substrate flatness causes focus errors.

SUMMARY OF THE INVENTION

The present invention overcomes focus errors due to lack of substrate flatness and provides a focus mechanism superior to a mechanical stage. The invention is applicable to projection-exposure use either a single light flux or a plurality of light fluxes.

A first embodiment of an apparatus according to the invention comprises a first reflective surface, a telecentric optical group, and a second reflective surface. The first reflective surface receives the light flux after transmission by the mask and delivers the flux to the telecentric optical group. The telecentric optical group images the mask in a focal plane. The second reflective surface receives the light flux from the telecentric optical group and reflects the light flux to a sensitized surface of a substrate such that the light flux is perpendicularly incident to the sensitized surface.

In order to place the sensitized surface in the focal plane of the telecentric optical group, the first reflective surface and the second reflective surface are moved by an actuator (e.g., plural piezoelectric elements attached to the first and second reflective surfaces) so that the optical path length between the mask and the substrate is changed, thereby moving the focal plane to the sensitized surface. The first reflective surface and the second reflective surface can move in unison or individually.

In a variation of the first embodiment, a focus sensor is provided that determines the displacement of the focal plane of the telecentric optical group from the sensitized surface. The focus sensor provides a focus signal to a focus controller that moves the first reflective surface and the second reflective surface so that the focal plane and the sensitized surface are coplanar (these planes are conjugate planes).

In a second embodiment, a plurality of light fluxes and corresponding optical systems image a plurality of regions on a mask onto a plurality of corresponding regions on a sensitized surface. Each optical system comprises first and second reflective surfaces and a telecentric optical group. A focus sensor is provided that determines displacements of multiple focal planes from the plurality of regions on the sensitized surface. A focus controller sends signals to an actuator that moves, for each optical system, the respective first and second reflective surfaces so that the focal planes of the telecentric optical group are coplanar with the respective region on the sensitized surface. In this way, surface flatness errors are overcome.

In a preferred configuration, the plurality of optical systems is arranged in two rows but other arrangements are possible. A single focus controller can be provided for all the optical systems or separate focus controllers can be provided for each optical system. A single focus controller or multiple focus controllers (i.e., one for each optical system) are satisfactory so long as the focal plane of each telecentric optical group can be made coplanar with the respective region on the sensitized substrate.

The invention provides example optical systems for use in conjunction with the movable reflective surfaces. The optical systems provided are preferably either both-side or image-side telecentric. One suitable optical system is a Dyson-type optical system comprising a lens and a mirror.

The foregoing and other objects, features, and advantages of the invention will become more apparent from the following detailed description which proceeds with reference to the accompanying drawings.

BRIEF DESCRIPTION OF THE DRAWINGS

FIGS. 1(A) and 1(B) show a projection-exposure apparatus according to a first example embodiment, wherein FIG. 1(B) is a view along the line A—A of FIG. 1(A).

DETAILED DESCRIPTION OF A PREFERRED EMBODIMENT

For convenience in describing the invention, coordinate axes are selected as shown in FIGS. 1–4. The coordinate axis are right-handed coordinate systems; the positive directions are indicated by arrows. In addition, as used herein, "telecentric" means either telecentric on an image side ("image-side telecentric") or telecentric on both an object and an image side ("both-side telecentric").

Example Embodiment 1

Figure 1A:
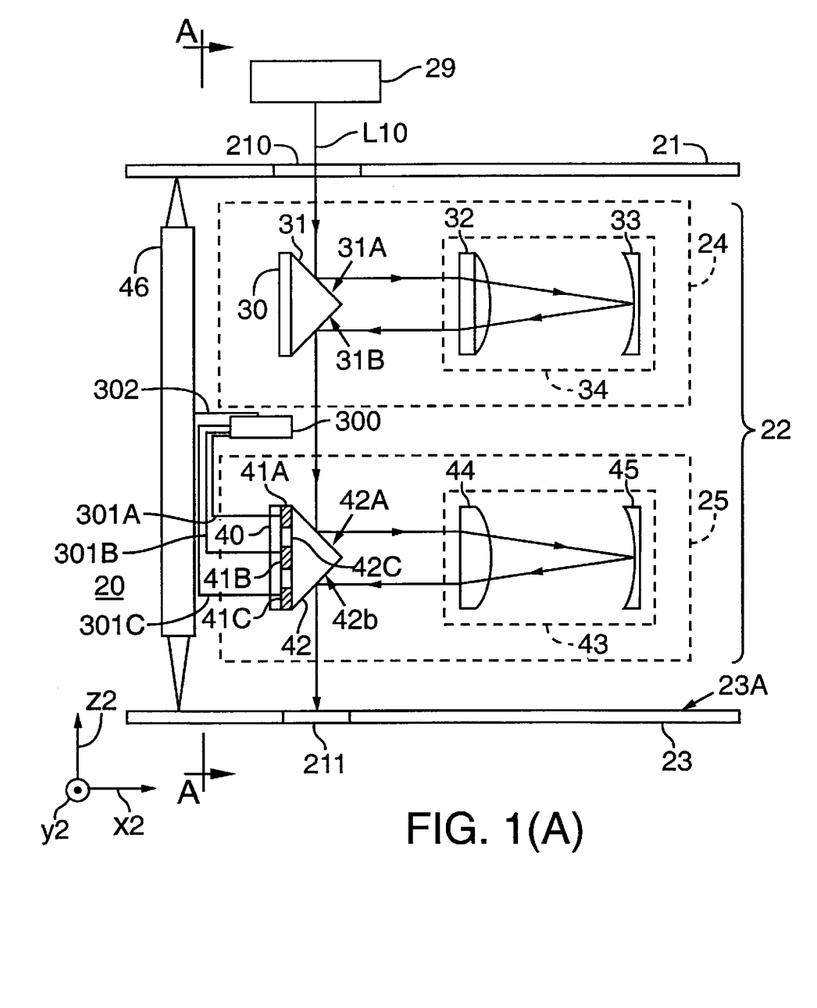
Figure 1B:
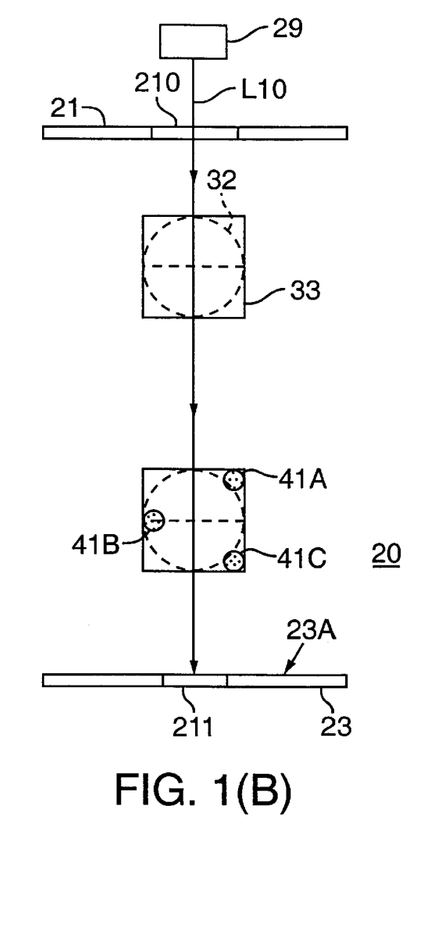

FIGS. 1(A) and 1(B) shows a projection-exposure apparatus 20 according to Example Embodiment 1. A mask 21 defines apattern to be transferred to a substrate 23. The mask 21 and the substrate 23 are held in planes parallel to the X2-Y2 plane of the coordinate axes; the mask 21 is positioned above the substrate 23. A light flux L10 from an optical irradiation system 29 is incident on the mask 21. After the light flux L10 is transmitted by the mask 21, an optical projection system 22 receives the light flux L10 and forms an image of the mask 21 on a sensitized surface 23A of the substrate 23.

In Example Embodiment 1, the optical irradiation system 29 and the optical projection system 22 are fixed with respect to each other by a mounting mechanism (not shown in FIG. 1). The mask 21 and the substrate 23 move together in the X2 and Y2 directions. The light flux L10 irradiates an irradiation region 210 that is fixed with respect to the light flux L10; because the optical projection system 22 is fixed with respect to the optical irradiation system 29, the optical projection system 22 images the irradiation region 210 onto a corresponding fixed transfer region 211.

By synchronously moving the mask 21 and the substrate 23 in the X2 and Y2 directions, the mask 21 moves through the fixed irradiation region 210. When a portion of the mask 21 moves into the irradiation region 210, the optical projection system 22 images that portion of the mask onto the corresponding portion of the substrate 23 situated in the transfer region. The substrate 23 moves through the fixed transfer region 211 synchronously with movement of the mask 21 through the irradiation region 210, so that each portion of the pattern defined by the mask 21 is projected correspondingly onto the sensitized surface 23A of the substrate 23. In this manner, the sensitized surface 23A receives the entire pattern of the mask 21.

The optical projection system 22 of Example Embodiment 1 further comprises a fixed optical subunit 24 and a variable optical subunit 25. The fixed optical subunit 24 comprises a first right-angle prism 31 and a first optical group 34. The hypotenuse face of the first right angle prism 31 is mounted to a prism holder 30. The first optical group 34 comprises a concave mirror 33 and a lens 32. The first optical group 34 is preferably both-side telecentric and provides aberration correction for the light flux L10.

After transmission by the mask 21, the light flux L10 propagates along an axis parallel to the Z2-axis. A surface 31A of the first right angle prism 31 reflects the light flux L10 in the +X2 direction. The lens 32 then directs the light flux L10 to the concave mirror 33 that in turn reflects the light flux L10 in the −X2 direction back to the lens 32. The lens 32 directs the light flux L10 to the first right angle prism 31; a surface 31B of the first right angle prism 31 reflects the light flux L10 in the −Z2-direction. After this reflection, the light flux L10 again propagates along an axis parallel to the Z2-axis. The lens 32 converges the light flux L10 so that an image of the mask 21 is formed between the fixed optical unit 24 and the variable optical unit 25.

The light flux L10 then enters the variable optical subunit 25. The variable optical subunit 25 has certain similarities to the fixed optical subunit 24. The variable optical subunit 25 comprises a second right angle prism 42, a variable prism holder 40, and a second optical group 43. The second optical group 43 is similar to the first optical group 34, comprising a lens 44 and a concave mirror 45. The variable optical subunit 25 differs from the fixed optical subunit 24 in that three piezoelectric elements 41A, 41B, 41C attach the hypotenuse surface 42C of the second right angle prism 42 to the variable prism holder 40. The second optical group 43 is also preferably both-side telecentric.

A surface 42A of the second right angle prism 42 reflects the light flux L10 received from the fixed optical subunit 24 in the +X2 direction. The lens 44 then directs the light flux L10 to the concave mirror 45 that in turn reflects the light flux L10 in the −X2 direction back to the lens 44. The lens 44 further directs the light flux L10 to a surface 42B of the second right angle prism 42. The surface 42B reflects the light flux L10 in the −Z2 direction. After reflection from the surface 42B, the light flux L10 again propagates along an axis parallel to the Z2-axis. The light flux L10 is then incident perpendicularly to the sensitized surface 23A of the substrate 23.

Figure 2:
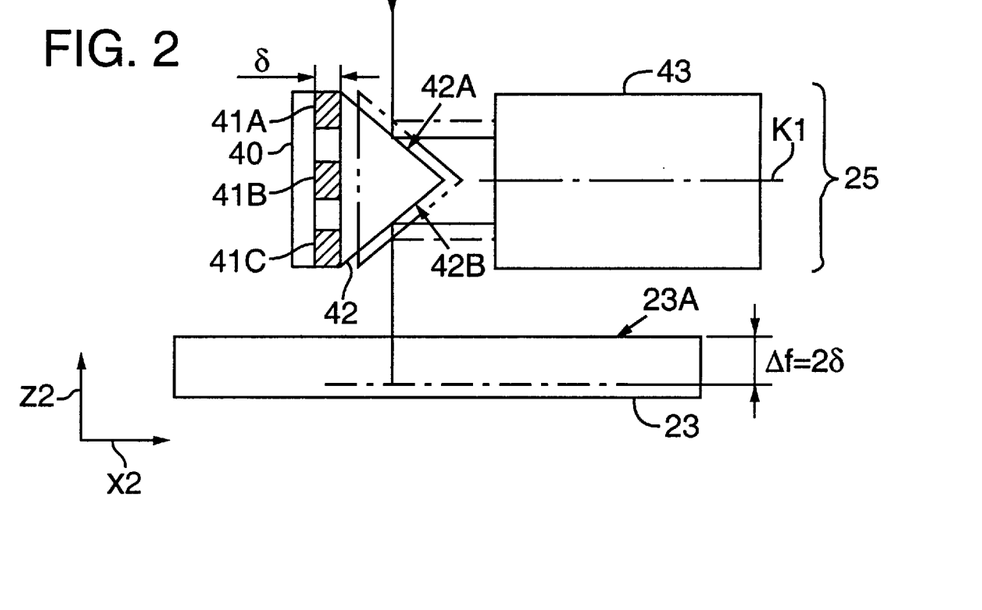
FIG. 2 shows the operation of a variable optical subunit of FIGS. 1(A) and 1(B).

The piezoelectric elements 41A, 41B, 41C of the variable optical subunit 25 expand and contract when electrical voltages are applied to them. If equal voltages are applied to the piezoelectric elements 41A, 41B, 41C, the piezoelectric elements 41A, 41B, 41C move equal distances. As shown in FIG. 2, with equal voltages applied, the right angle prism 42 moves parallel to the X2-direction along an optical axis K1 of the second optical group 43. If the second right angle prism 42 moves a distance δ along the optical axis K1, then the optical path length of the light flux L10 changes by a distance Δf given by the following equation:

$$\Delta f = 2\delta \quad (1)$$

The distance Δf represents a change in the optical path length between the mask 21 and the sensitized surface 23A of the substrate 23. Accordingly, by appropriately adjusting the voltages applied to the piezoelectric elements 41A, 41B, 41C the image of the mask 21 formed on the sensitized surface 23A can be focused.

The projection-exposure apparatus 20 further comprises a focus sensor 46 placed between the mask 21 and the substrate 23 as shown in FIG. 1. The focus sensor 46 detects the position of the sensitized surface 23A along the Z2-axis. The focus sensor 46 supplies a focus signal from a focus signal output 302 to a focus controller 300. The focus controller 300 supplies drive voltages to the piezoelectric devices 41A, 41B, 41C via respective drive voltage outputs 301A, 301B, 301C.

The focus controller 300 causes the piezoelectric elements 41A, 41B, 41C to expand or contract based on the voltages delivered via the focus signal outputs 301A, 301B, 301C; the focus controller determines appropriate voltages using the focus signal output 302. The piezoelectric elements 41A, 41B, 41C move the variable right angle prism 42 substantially parallel to the X2-axis a distance equal to the amount of piezoelectric element expansion or contraction. Thus, an image of the mask 21 can be focused on the sensitized surface 23A of the substrate 23.

It will be readily apparent that the voltages applied to the piezoelectric devices 41A, 41B, 41C can differ from each other. In particular, slight variations in the piezoelectric expansion of the piezoelectric elements 41A, 41B, 41C necessitate slight variations in the applied voltages necessary to drive each the same amount. It will also be apparent that means other than piezoelectric elements can be used to move the second right angle prism 42. For example, a cam mechanism or a ball screw are appropriate.

During the operation of the projection-exposure apparatus 20, the light flux L10 exposes the sensitized surface 23A to the patterns defined by the mask 21. By synchronously moving the mask 21 and the substrate 23 in the X2 and Y2 directions, the light flux L10 can scan the entire sensitized surface 23A of the substrate 23. Based on the focus signal output 302 from the focus sensor 46, the focus controller 300 supplies focus voltages to the piezoelectric elements 41A, 41B, 41C of the variable optical subunit 25. These voltages can change as exposure of the sensitized surface 23a progresses to form a focused image of the mask 21 on the sensitized surface 23a.

The projection-exposure apparatus 20 forms a focused image of the mask 21 on the sensitized surface 23A of the substrate 23 without having to employ a Z-stage 6 of the conventional projection-exposure apparatus 1 of FIG. 9. Therefore, the projection-exposure apparatus 20 can be made simpler and smaller than a conventional projection-exposure apparatus.

It is readily apparent that a projection-exposure apparatus according to Example Embodiment 1 can have only the variable optical subunit 25 without the fixed optical subunit 24. Such a projection-exposure apparatus would typically form an inverted image of the mask 21 on the sensitized surface 23A rather than the upright image produced by the apparatus of FIG. 1. Production of an inverted image necessitates a change in the relative motion of the mask 21 and the substrate 23.

Example Embodiment 2

Figure 3:
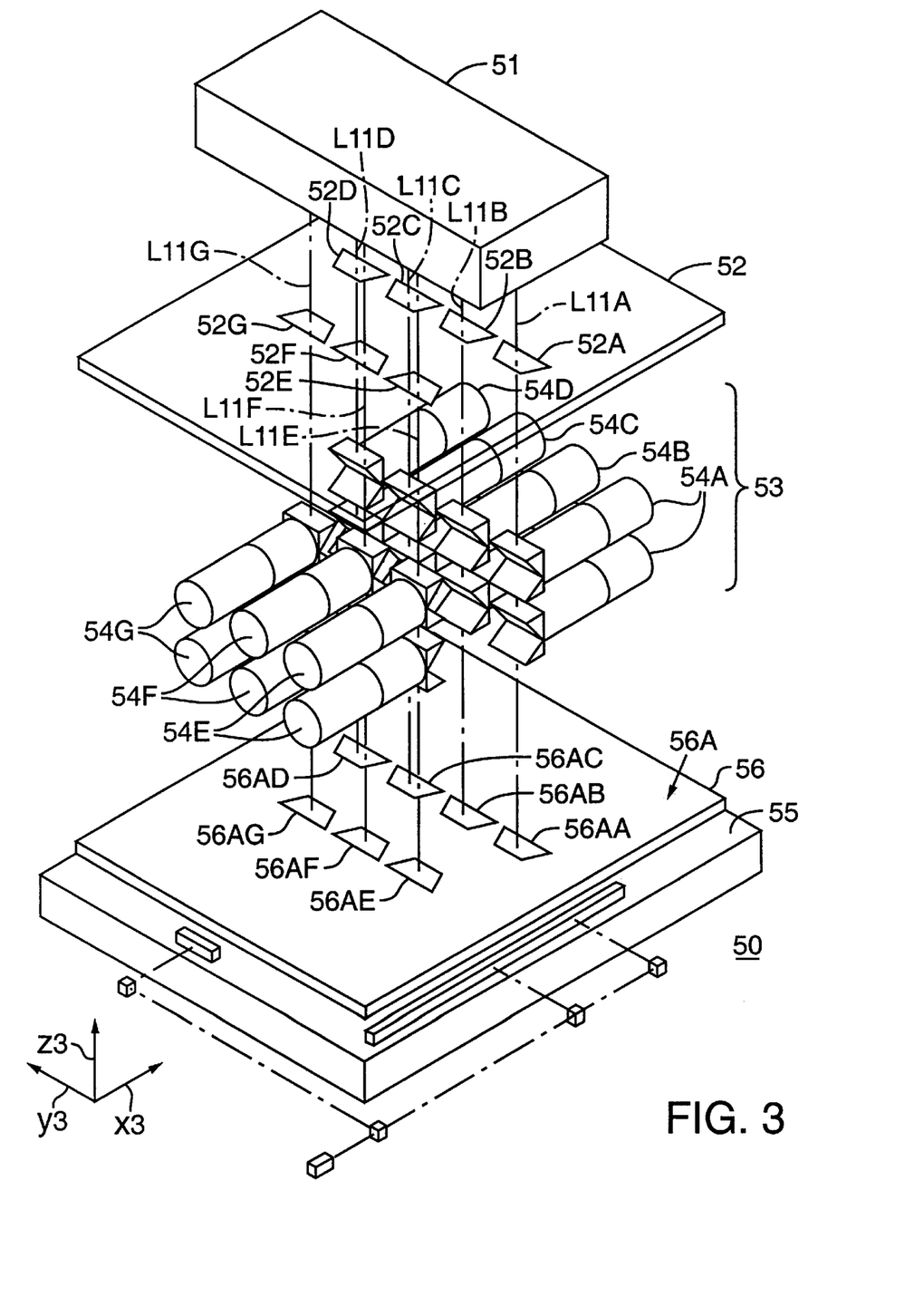
FIG. 3 shows a projection-exposure apparatus according to a second example embodiment.

FIG. 3 shows Example Embodiment 2 of a projection-exposure apparatus 50. A plurality of light fluxes L11A, . . . , L11G (hereinafter L11A–L11G) from an optical irradiation system 51 irradiate corresponding mask regions 52A, . . . , 52G (hereinafter 52A–52G) of a mask 52. The mask regions 52A–52G of the mask 52 are imaged onto respective substrate regions 56AA, . . . , 56AG (hereinafter 56AA–56AG) of a sensitized surface 56A of a substrate 56 by respective optical projection subsystems 54A, . . . , 54G (hereinafter 54A–54G). A stage 55 holds the substrate 56 so that the mask 52 and the substrate 56 are parallel and opposite to each other. The optical projection subsystems 54A–54G collectively form an optical projection system 53.

The mask regions 52A–52G are irradiated by the light fluxes L11A–L11G, respectively, and form two rows extending in the Y3 direction. In Example Embodiment 2, the mask regions 52A–52D form a first row and the mask regions 52E–52G form a second row. The shape of the mask regions of the first row are preferably complementary to the shapes of the mask regions of the second row so that in X3-directed scanning all areas on the substrate 56 are equally exposed. Whereas Example Embodiment 2 uses seven optical projection subsystems, it will be apparent to those skilled in the art that fewer or more could be used and the invention is not limited to any particular number.

The mask 52 and the stage 55 are both fixed to a mount (not shown in figure) and therefore move together with the mount relative to the optical projection subsystems. During operation, a drive mechanism (not shown) drives the mount parallel to the X3-axis.

Each of the optical projection subsystems 54A–54G comprises, preferably, a both-side telecentric optical system that forms an erect image with unit magnification. The optical projection subsystems 54A–54G image the mask regions 52A–52G onto corresponding exposure regions 56AA–56AG on the sensitized surface 56A of the substrate 56. Each exposure region 56AA–56AG thereby receives an image of a respective region 52AA–52AG of the pattern defined by the mask. In Example Embodiment 2, the mask regions 52A–52G are opposite to the exposure regions 56AA–56AG. By moving the mask 52 and the stage 55 together in the X3 direction, the entire sensitized surface 56A of the substrate 56 can be exposed to the entire pattern defined by the mask 52.

Figure 4:
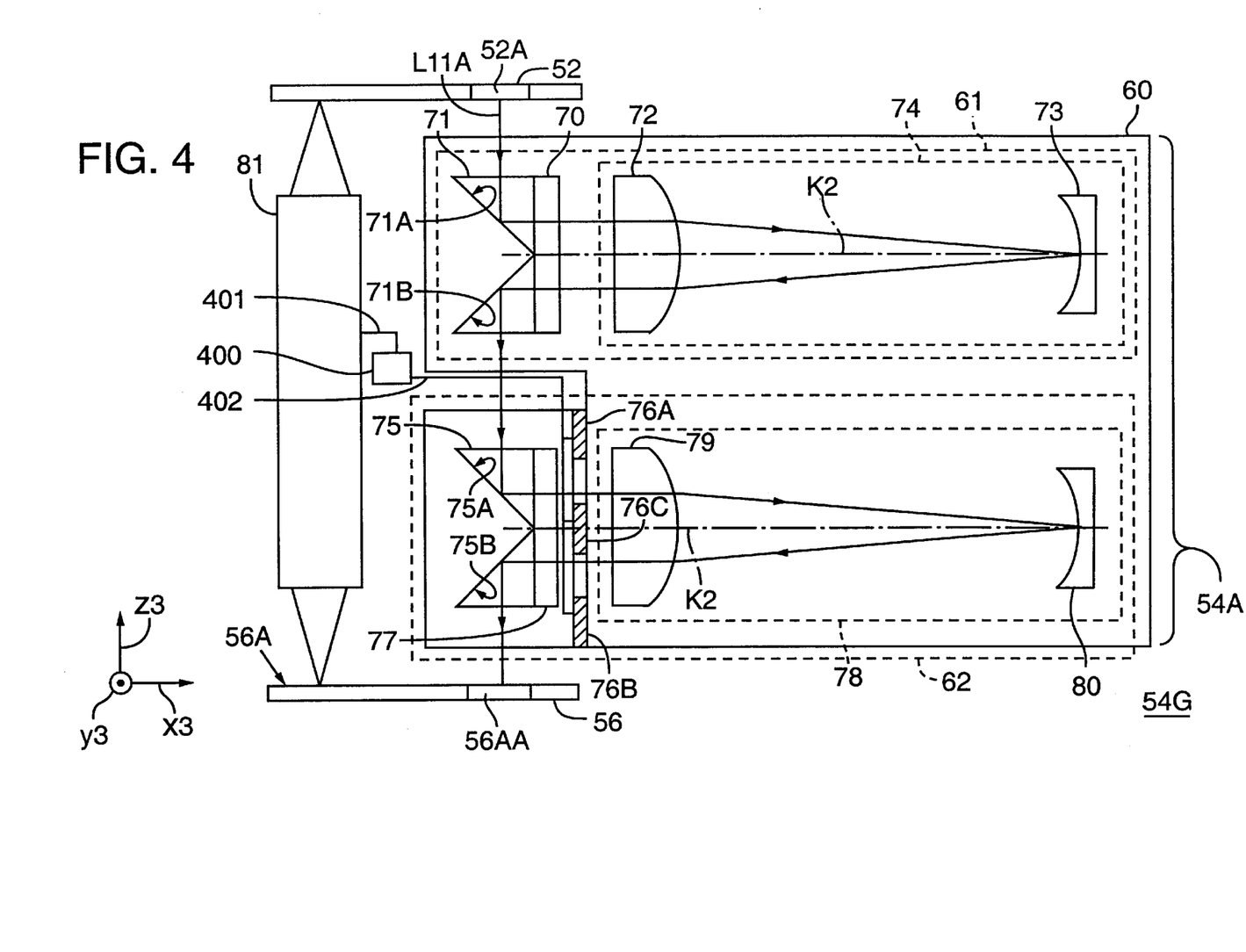
FIG. 4 shows an optical projection system of the projection-exposure apparatus of FIG. 3.

Referring now to FIG. 4, because the optical projection subsystems 54A–54G are identical to each other, a fixed optical subunit 61 and a variable optical subunit 62 are described with reference to the optical projection subsystem 54A as an example. The fixed optical subunit 61 and the variable optical subunit 62 are contained in an optical unit housing 60.

The fixed optical subunit 61 comprises a prism 71 mounted to a plane-parallel glass plate 70 and an optical group 74 comprising a lens 72 and a concave mirror 73. The optical group 74 is preferably both-side telecentric. The lens 72 corrects aberrations in the light flux L11A; the lens 72 and the concave mirror 73 form an image of the mask 52 at a location between the fixed optical subunit 61 and the variable optical subunit 62.

A surface 71A of the prism 71 reflects the light flux L11A transmitted by the mask region 52A in the +X3 direction. The light flux L11A is next transmitted through the lens 72 to the concave mirror 73 of the optical group 74. The concave mirror 73 reflects the light flux L11A in the −X3 direction back through the lens 72. The lens 72 and the concave mirror 73 form an image of the mask 52 between the fixed optical subunit 61 and the variable optical subunit 62. Next, the light flux is transmitted by the plane-parallel glass plate 70 and is reflected by a surface 71B of the prism 71 in the −Z3 direction.

The variable optical subunit 62 has certain similarities to the fixed optical subunit 61. The variable optical subunit 62 comprises a prism 75 and an optical group 78. The optical group 78 is preferably both-side telecentric. Unlike the fixed optical subunit 61, the prism 75 of the variable optical subunit 62 is attached to the optical unit housing 60 with piezoelectric elements 76A–76C. In the variable optical subunit 62, the light flux L11A from the fixed optical subunit 61 reflects from a first surface 75A of the prism 75 in +X3 direction. The light flux L11A then enters the optical group 78. A lens 79 of the optical group 78 transmits the light flux L11A to a concave mirror 80. The concave mirror 80 reflects the light flux L1A in the −X3 direction. The light flux L11A is transmitted by the lens 79 through a plane-parallel glass plate 77 and reflected by a surface 75B of the prism 75 in the −Z3 direction. The light flux then irradiates the exposure region 56AA of the substrate 56.

The piezoelectric elements 76A–76C that attach the prism 75 to the optical unit housing 60 typically receive equal voltages and therefore expand or contract equally. The expansion and contraction of the piezoelectric elements 76A–76C move the prism 75 in the X3 direction (i.e., along an optical axis K2 of the optical group 78). This movement alters the optical path length of the light flux L11A by a distance $\Delta f$ that is given by Equation 1 wherein $\delta$ is the distance the prism 75 moves in the X3 direction. Because the focal point of the light flux L11A moves in the Z3 direction as the prism 75 moves in the X3 direction, adjustments in the voltages applied to the piezoelectric elements 76A–76C enables the light flux L11A to be focused on the exposure region 56AA.

A focus sensor 81 associated with the optical projection subsystem 54A is placed between the mask 52 and the substrate 56. The focus sensor 81 detects the height of the sensitized surface 56A along the Z3-axis. A focus controller 400, via the output 401 receives signals from the focus controller 81. The focus controller 400 supplies voltages to the piezoelectric elements 76A–76C via an output 402.

The focus controller 400 supplies voltages that cause the piezoelectric elements 76A–76C of the variable optical subunit 62 of the optical projection subsystem 54A to expand and contract an amount based on the focus signal output from the focus sensor 81, thereby moving the prism 75 and focussing the light flux L11A on the exposure region 56AA.

In operation, the projection-exposure apparatus 50 scans the mask 52 and the stage 55 back and forth in the X3 direction to expose the entire substrate 56.

In order to focus the light fluxes L11A–L11G, the projection-exposure apparatus 50 first executes a forward scan, in which the mask 52 and the stage 55 move together in the +X3 direction, but without exposing the sensitized substrate 56A. During the forward scan, the focus controller 400 receives height information about the sensitized surface 56A at a plurality of locations. Using this height information, the focus controller forms a surface flatness map of the substrate 56.

After completing the forward scan, the projection-exposure apparatus 50 executes a return scan in the −X3 direction during which the sensitized surface 56A is exposed. During the return scan, the mask 52 and the stage 55 move together and the piezoelectric elements 76A–76C are driven according to the surface flatness map obtained in the forward scan so that the light flux L11A is focused on the sensitized surface 56A.

The other optical projection subsystems 54B–54G can similarly focus the corresponding light fluxes L119–L11G on the corresponding exposure regions 56AB–56AG. The optical projection subsystems units 54B–54G have independently controlled piezoelectric elements that are in turn controlled by a respective focus controller. During the forward scan, each focus controller receives surface-height data from respective focus sensors. The focus controllers thus set the voltages for the piezoelectric elements of the respective optical projection subsystems 54A–54G. because the optical projection subsystems 54A–54G are independently controlled, the light fluxes L11A–L11G can be independently focused on the sensitized surface 56A even if the sensitized surface 56A is not flat.

In Example Embodiment 2, the optical projection subsystems 54A–54G are identical. The optical projection subsystems 54A–54G each comprise two preferably both-side telecentric optical groups. These telecentric optical groups are a Dyson-type design.

With respect to FIG. 4, if the focus sensor 81 is placed in the scan direction ahead of the exposure region 56AA, the height of the sensitized surface 56A in the exposure region 56AA can be obtained during the forward scan and relayed to the focus controllers. When the exposure region 56AA subsequently reaches a region in which the substrate 56 is exposed to the light flux L11A, the piezoelectric devices of the optical projection subsystem 54A can be adjusted to provide a focused image for that exposure region. Similarly focussing the remaining optical projection subsystems 54B–54G, the substrate 56 can be exposed during the forward scan.

In Example Embodiments 1 and 2, the movable reflectors of the variable subunits are moved together. Other reflector arrangements are also suitable. For example, the moving reflectors can move independently.

Other Example Embodiments

In Example Embodiments 1 and 2, a combination of a concave mirror and a lens was employed to form an image of a region of a mask between the fixed and variable optical subunits. The invention is not restricted to this combination and other optical systems can be used. Similarly, in Example Embodiments 1 and 2, focus sensors are located between the substrate and the mask. It will be readily apparent that other focus sensors are equally applicable. In Example Embodiments 1 and 2, the optical groups that image the mask onto the substrate are preferably both-side telecentric, but the present invention is not restricted to both-side telecentric optical groups; substrate-side telecentricity (image-side) is sufficient.

Other illustrative arrangements are shown in FIGS. 5–8. In each of the optical systems of FIGS. 5–8, a movable surface reflects a light flux from a mask; the movable surface moves in a direction that changes the optical path length of the light flux. An optical imaging system forms an image of the mask and a second surface reflects the light flux from the optical imaging system so that it is perpendicularly incident to the substrate.

Figure 5:
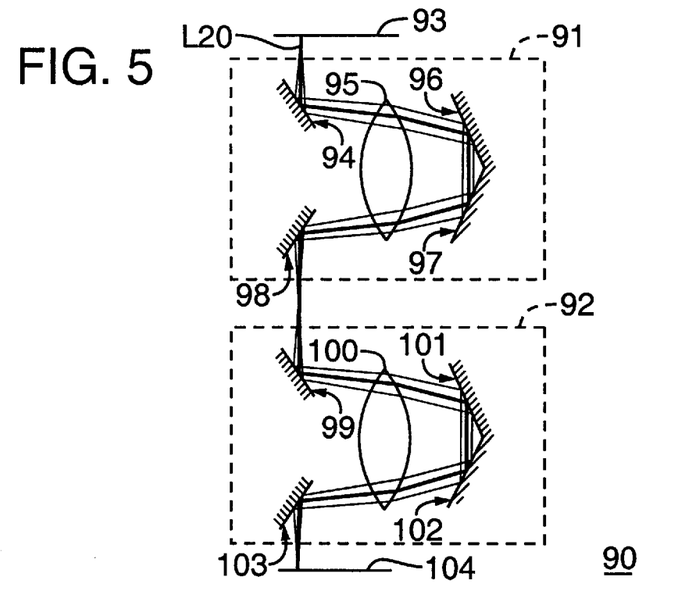
FIG. 5 shows a projection-exposure apparatus according to a third example embodiment.

For example, a third example embodiment of a projection-exposure apparatus 90 is shown in FIG. 5. The projection-exposure apparatus 90 comprises a fixed optical subunit 91 and a variable optical subunit 92. A light flux L20 transmitted by a region on a mask 93 is incident to the fixed optical subunit 91. A first reflector 94 reflects the light flux L20 through a converging lens 95. The converging lens 95 collimates the light flux L20. The light flux L20 is then successively reflected by a second reflector 96 and a third reflector 97. The third reflector 97 reflects the light flux L20 back through the converging lens 95. A fourth reflector 98 then reflects the light flux L20 and the light flux L20 exits the fixed optical subunit 91.

Upon exiting the fixed optical subunit 91, the light flux L20 propagates parallel to its direction of propagation when it entered the fixed optical subunit 91. After reflection by the reflector 98, the light flux L20 forms an image of the mask 93 at a location between the fixed optical subunit 91 and the variable optical subunit 92.

The variable optical subunit 92 has certain similarities to the fixed optical subunit 91. The variable optical subunit 92 has first, second, third, and fourth reflectors 100, 101, 102, 103, respectively, and a converging lens 100. Unlike the fixed optical subunit 91, at least one of the first and fourth reflective surfaces 99, 103 moves in a direction that changes the optical path length of the light flux L20. The converging lens 100 of the variable optical subunit 92 receives the light flux L20 after reflection of the light flux by the first reflector 99 of the variable optical subunit 92. The converging lens 100 then collimates the light flux L20; the light flux then reflects from the reflectors 101, 102 back through the converging lens 100. The converging lens 100 causes the light flux L20 to form an image of the region on the mask 93 on a corresponding region on the substrate 104. The light flux L20 is reflected by the reflector 103 toward the substrate.

It will be apparent to those skilled in the art that the fixed optical subunit 91 and the variable optical subunit 92 can be employed in Example Embodiments 1 and 2. I.e., the fixed optical subunit 91 and the variable optical subunit 92 can replace the fixed optical subunit 24 and the variable optical subunit 25 of Example Embodiment 1. Similarly, the fixed optical subunit 61 and the variable optical subunit 62 of the optical projection subsystems 54A–54G of Example Embodiment 2 can be correspondingly replaced.

Figure 6:
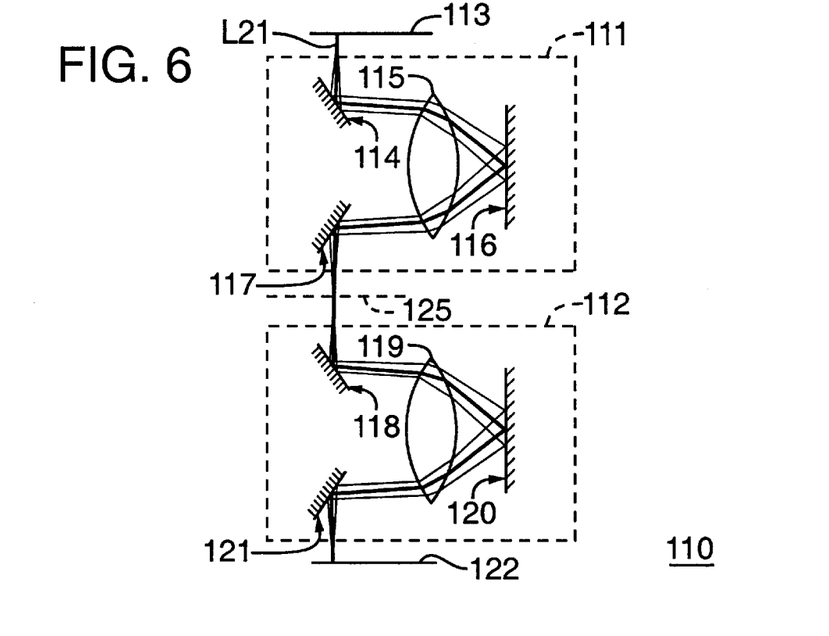
FIG. 6 shows a projection-exposure system according to a fourth example embodiment.

A fourth example embodiment of a projection-exposure apparatus according to the invention is shown in FIG. 6. With reference to FIG. 6. The projection-exposure apparatus 110 comprises a fixed optical subunit 111 and a variable optical subunit 112. The fixed optical subunit 111 receives a light flux L21 that has been transmitted by a region on a mask 113. In the fixed optical subunit 111, a first reflector 114 reflects the light flux L21 through a converging lens 115 and to a second reflector 116. The converging lens 115 collimates the light flux L21 before the light flux L21 reaches the reflector 116. The second reflector 116 reflects the light flux L21 back through the converging lens 115. The converging lens 115 directs the light flux L21 to a third reflector 117 that reflects the light flux L21 to the variable optical subunit 112. Upon exiting the fixed optical subunit 111, the light flux L21 propagates parallel to the direction in which it propagated before entering the fixed optical subunit 111. The converging lens 116 causes an image of the region of the mask to form between the fixed optical subunit 111 and the variable optical subunit 112 at a focal plane 125.

The variable optical subunit 112 has certain similarities to the fixed optical subunit 111. The variable optical subunit 113 has first, second, and third reflectors 118, 120, 121, respectively, and a converging lens 119. Unlike the fixed optical subunit 111, at least one of the first and third reflectors 118, 121 moves in a direction that changes the optical path length of the light flux L21. The converging lens 119 of the variable optical subunit 112 receives the light flux L21 after reflection by the first reflector 118 of the variable optical subunit 112. The converging lens 119 then collimates the light flux L21; the light flux L21 then reflects from the reflector 120 back through the converging lens 119. The converging lens 119 causes the light flux L21 to form an image of the region of the mask 113 on a corresponding region of the substrate 122. The light flux L20 is then reflected by the reflector 121 toward a substrate 122.

It will be apparent to those skilled in the art that the fixed optical subunit 111 and the variable optical subunit 112 can be used in Example Embodiments 1 and 2. The fixed optical subunit 111 and the variable optical subunit 112 can replace the fixed optical subunit 24 and the variable optical subunit 25, respectively, of Example Embodiment 1. Similarly, the fixed optical subunit 111 and the variable optical subunit 112 can replace the fixed optical subunit 61 and the variable optical subunit 62, respectively, of the optical projection subsystems 54A–54G of Example Embodiment 2.

Figure 7:
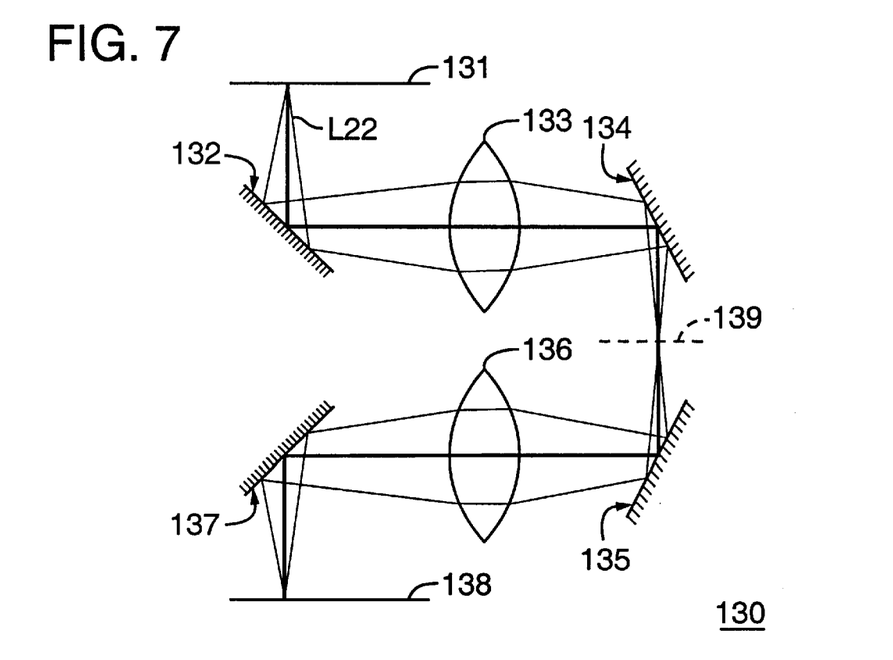
FIG. 7 shows a projection-exposure system according to a fifth example embodiment.

FIG. 7 shows a fifth example embodiment of a projection-exposure apparatus according to the invention. In the projection-exposure apparatus 130 of FIG. 7, a light flux L22 is transmitted by a region of a mask 131. A first reflector 132 reflects the light flux L22 through a first converging lens 133 to a second reflector 134. Thereafter, the light flux L22 reflects from a third reflector 135 through a second converging lens 136. Between the second reflector 134 and the third reflector 135 an image of the region of the mask 131 is formed at a plane 139. A fourth reflector 137 reflects the light flux L22 to a corresponding region of a sensitized surface of a substrate 138.

In the projection-exposure apparatus of FIG. 7, either the first reflector 132 or the second reflector 137 moves so that the path length of the light flux L22 changes. It will be apparent that moving both the first reflector 132 and the second reflector 137 can vary the optical path length.

Figure 8:
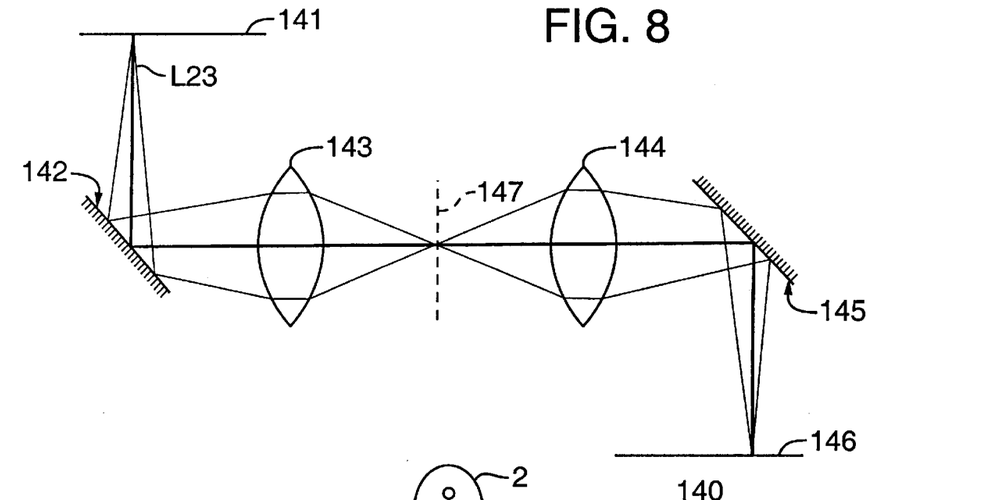
FIG. 8 shows a projection-exposure system according to a sixth example embodiment.

FIG. 8 shows a sixth example embodiment of a projection-exposure apparatus according to the invention. In the projection-exposure apparatus 140 of FIG. 8, a light flux L23 diverges from a region on a mask 141. After transmission by the mask 141, the light flux L23 reflects from a first reflector 142 to a first converging lens 143. The first converging lens 143 forms an image of the region of the mask 141 at a focal plane 147. A second converging lens 144 then receives the light flux L23 and forms another image of the region of the mask 141 on a corresponding region on a sensitized substrate 146. A second reflector 145 reflects the light flux L23 onto the sensitized surface of a substrate 146.

In the projection-exposure apparatus 140, at least one of the first reflector 142 and the second reflector 145 moves in a direction that changes the optical path length of the light flux L23, permitting focusing of the image of the region of the mask 141 formed by the second converging lens 144 on the substrate 146.

Having illustrated and demonstrated the principles of the invention in multiple example embodiments, it should be apparent to those skilled in the art that the example embodiments can be modified in arrangement and detail without departing from such principles. We claim as the invention all that comes within the scope of these claims.

What is claimed is:

1. An optical projection system for transferring a pattern defined by a mask to a sensitized substrate, the system comprising:
   (a) first and second reflective surfaces, the first reflective surface being situated so as to reflect a light flux transmitted by a region of the mask;
   (b) a first optical system that receives the light flux reflected from the first reflective surface and forms an image of the region of the mask on a first focal plane;
   (c) the second reflective surface being situated so as to receive the light flux from the first optical system and to reflect the light flux toward a corresponding region of the sensitized surface; and
   (d) an actuator operable to move at least one of the reflective surfaces in a direction that changes the optical path length of the light flux.

2. The optical projection system of claim 1, wherein the actuator moves at least one of the first and second reflective surfaces so that the first focal plane is on the region of the sensitized surface.

3. The optical projection system of claim 1, wherein the first and second reflective surfaces are on adjacent surfaces of a first prism, and the actuator is operable to move the first prism.

4. The optical projection system of claim 1, wherein the first optical system is telecentric and comprises a lens for correcting optical aberrations.

5. The optical projection system of claim 4, wherein the lens in the first optical system has positive refractive power.

6. The optical projection system of claim 5, wherein the first optical system further comprises a concave mirror operable to reflect light, that has passed through the lens, back through the lens to the second reflective surface.

7. The optical projection system of claim 1, further comprising
   a third reflective surface situated so as to reflect light from the second reflective surface;
   a second optical system that receives the light flux from the third reflective surface and forms an image of the region of the mask on a second focal plane; and
   a fourth reflective surface situated to reflect light from the second optical system to the second image plane.

8. The optical projection system of claim 7, wherein the first image plane is situated between the first and second optical systems.

9. The optical projection system of claim 7, wherein the first and second reflective surfaces are on adjacent surfaces of a first prism, and the third and fourth reflective surfaces are on adjacent surfaces of a second prism, the actuator being operable to move the second prism.

10. The optical projection system of claim 9, wherein each of the first and second optical systems comprises a positive lens and a concave mirror situated so as to receive the light flux passing through the positive lens and to reflect the light flux back through the positive lens.

11. The optical projection system of claim 10, wherein the actuator is operable to move the second prism so as to place the second focal plane on the region of the sensitized surface.

12. The optical projection system of claim 11, further comprising a focus sensor that determines a displacement of the region of the sensitized surface from the second focal plane.

13. The optical projection system of claim 12, further comprising a focus controller in communication with the focus sensor and with the actuator, the actuator being controllably operated by the focus controller.

14. The optical projection system of claim 2, further comprising a focus sensor that determines a displacement of the region of the sensitized surface from the first focal plane.

15. The optical projection system of claim 14, further comprising a focus controller in communication with the focus sensor and with the actuator, the actuator being controllably operated by the focus controller.

16. The optical projection system of claim 1, wherein the actuator comprises a piezoelectric element.

17. The optical projection system of claim 1, further comprising a second optical system that receives the light flux from the first optical system, wherein the first focal plane is situated between the first and second optical systems.

18. The optical projection system of claim 17, wherein the second optical system is telecentric and forms an image of the region of the mask on a second focal plane.

19. The optical projection system of claim 18, wherein the actuator is operable to make the second focal plane conjugate with the sensitized surface of the substrate.

20. A projection-exposure apparatus for transferring a pattern defined by a mask to a sensitized surface of a substrate, the apparatus comprising:
   (a) a first reflective surface situated and configured to reflect a light flux transmitted through a region of a mask illuminated by the light flux;
   (b) an optical system situated and configured to receive the light flux from the first reflective surface and form an image of the illuminated mask in a focal plane; and
   (c) a second reflective surface situated and configured to receive the light flux from the optical system and reflect the light flux toward a corresponding region on a sensitized surface of a substrate, the first and second reflective surfaces being movable in a direction that changes the optical path length of the light flux from the mask to the substrate so that the first focal plane and the sensitized surface are conjugate surfaces.

21. The apparatus of claim 20, further comprising an actuator operable to move at least one of the first and second reflective surfaces relative to the other reflective surface.

22. The apparatus of claim 21, further comprising:
   a focus sensor situated and configured to determine a displacement of the sensitized surface from the first focal plane; and
   a focus controller in communication with the focus sensor and the actuator, the focus controller controlling the actuator based on the displacement determined by the focus sensor.

23. The apparatus of claim 20, wherein the first and second reflective surfaces are formed on a body.

24. The apparatus of claim 23, wherein the first and second reflective surfaces are formed on a prism.

25. The apparatus of claim 20, further comprising a scanner operable to scan the mask and the substrate relative to the first and second reflective surfaces and the optical group so as to scannably transfer the mask pattern to the sensitized surface.

26. The apparatus of claim 25, operable to simultaneously transfer a pattern defined by multiple regions on the mask to corresponding multiple regions on the sensitized surface of the substrate.

27. A method for transferring, using an optical projection system, a pattern defined by a mask to a sensitized surface of a substrate, the method comprising the steps:

(a) providing first and second reflective surfaces that are movable in a direction that changes an optical path length between the first and second reflective surfaces;

(b) passing a light flux through an illuminated region of a mask to the first reflective surface;

(c) passing the light flux reflected from the first reflective surface through an optical system that transmits the light flux to the second reflective surface; and (d) reflecting the light flux from the second reflective surface to a focal plane at which the optical system forms an image of the illuminated region of the mask on a corresponding region of a sensitized substrate.

28. The method of claim 27, further comprising the step of providing an actuator operable to move at least one of the reflective surfaces so that the mask and the sensitized surface are conjugate.

29. The method of claim 27, wherein the first and second reflective surfaces are formed on surfaces of a prism.

30. The method of claim 27, wherein the optical system is a telecentric optical system that comprises a lens for correcting optical aberrations.

31. The method of claim 27, wherein the optical system comprises a concave mirror operable to reflect light, that has passed through the lens, back through the lens to the second reflective surface.

32. The method of claim 28, further comprising the step of determining, using a focus sensor, a displacement of the sensitized surface from a conjugate plane of the mask.

33. The method of claim 32, further comprising the step of controlling, using a focus controller in communication with the focus sensor and with the actuator, the actuator so as to achieve a desired focus.

34. The method of claim 28, wherein the actuator comprises a piezoelectric element.

35. An exposure method for transferring a pattern defined by multiple regions of a mask to corresponding multiple regions on a sensitized substrate, the method comprising the steps of:

(a) irradiating a light flux on multiple regions of a mask;

(b) reflecting respective light fluxes transmitted through the multiple regions of the mask using respective first reflective surfaces situated relative to the respective multiple regions;

(c) passing the light fluxes reflected from the respective first reflective surfaces through respective optical systems to form respective images of the respective irradiated regions of the mask on corresponding multiple regions in a focal plane;

(d) using respective second reflective surfaces, reflecting the light fluxes from the respective multiple optical systems toward respective regions on a surface of a sensitized substrate; and (e) positionally adjusting at least one of the first and second reflective surfaces relative to each other as required to place the focal plane and the surface of the sensitized substrate conjugate to each other.

36. The method of claim 35, wherein, in step (e), one of the first and second reflective surfaces is adjusted using an actuator.

37. The method of claim 36, further comprising the step of determining a displacement of the sensitized surface from the focal plane, wherein the actuator moves one of the first and second reflective surfaces based on the determined displacement.

38. The method of claim 36, wherein the first and second reflective surfaces are formed on a prism.

39. The method of claim 35, further comprising the step of scanning the mask and the sensitized substrate relative to the reflective surfaces and the optical systems so as to scannably transfer the mask pattern to the sensitized surface.

* * * * *

UNITED STATES PATENT AND TRADEMARK OFFICE
CERTIFICATE OF CORRECTION

PATENT NO. : 5,959,784

DATED : September 28, 1999

INVENTOR(S) : Seki et al.

It is certified that error appears in the above-identified patent and that said Letters Patent is hereby corrected as shown below:

Column 2, line 6, the second occurrence of "15A," should be deleted.

Column 2, line 8, the comma "," should be a period --.--.

Column 3, line 58, "axis" should be --axes--.

Column 3, line 66, "shows" should be --show--.

Column 4, line 1, "apattern" should be --a pattern--.

Column 4, line 37, "right-angle" should be --right angle--

Column 4, line 51, "-Z2-direction" should be -- -Z2 direction --.

Column 5, line 19, "X2-direction" should be --X2 direction--.

Column 6, lines 2 and 4, "23a" should be --23A--.

Column 7, line 63, a comma --,-- should be added after "401".

Column 8, line 28, "L119-L11G" should be --L11B-L11G--.

Column 9, line 66, "FIG. 6. The" should be --FIG. 6, the--.

Column 11, line 54, claim 7, a colon --:-- should be added after "comprising".

Signed and Sealed this

Twenty-second Day of May, 2001

Attest:

NICHOLAS P. GODICI

*Attesting Officer*   *Acting Director of the United States Patent and Trademark Office*